United States Patent [19]

Zuber et al.

[11] 4,202,703
[45] May 13, 1980

[54] METHOD OF STRIPPING PHOTORESIST

[75] Inventors: John R. Zuber, Piscataway; Herbert Foxman, Raritan, both of N.J.

[73] Assignee: RCA Corporation, New York, N.Y.

[21] Appl. No.: 849,471

[22] Filed: Nov. 7, 1977

[51] Int. Cl.² .................. C03C 23/00; B08B 7/00; B08B 30/00
[52] U.S. Cl. .................................. 134/2; 134/29; 134/38
[58] Field of Search .............. 134/2, 26, 29, 38, 42; 252/158, 547

[56] References Cited

U.S. PATENT DOCUMENTS

| | | | |
|---|---|---|---|
| 2,445,064 | 7/1948 | Hall et al. | 252/158 |
| 2,710,843 | 6/1955 | Stebleton | 252/158 |
| 3,673,099 | 6/1972 | Corby et al. | 134/38 |
| 3,796,602 | 3/1974 | Briney | 134/38 |
| 3,813,309 | 5/1974 | Bakos et al. | 134/38 |
| 3,877,474 | 4/1975 | Urssing et al. | 134/27 |
| 3,980,587 | 9/1976 | Sullivan | 134/38 |
| 3,988,256 | 10/1976 | Vandermey et al. | 134/38 |
| 4,089,704 | 5/1978 | Heiss, Jr. et al. | 134/29 |

*Primary Examiner*—Joseph Scovronek
*Assistant Examiner*—Chris Konkol
*Attorney, Agent, or Firm*—H. Christoffersen; B. E. Morris; W. J. Burke

[57] ABSTRACT

A solution of tetramethylammonium hydroxide and a surfactant in a lower alcohol solubilizes photoresist films without attacking materials found in integrated circuit devices so that a subsequent 1,1,1-trichloroethane rinse completely removes the photoresist.

5 Claims, No Drawings

METHOD OF STRIPPING PHOTORESIST

This invention relates to a method of stripping photoresist. More particularly, this invention relates to a method of stripping photoresist with a solvent that does not attack metals.

BACKGROUND OF THE INVENTION

In the manufacture of integrated circuits, thick metal contacts are put down, such as by electroplating, in certain predetermined areas. This is generally done by photolithographic techniques, whereby a layer of photoresist is applied over the device, the photoresist is exposed to a patterned light source and developed to form openings in the resist layer. The metal contacts are then applied in the opened areas, and the photoresist is then stripped away with a solvent.

When the metal contacts are comparatively thick, on the order of 1 mil (25.4 microns), thick film resists can be advantageously employed. Such resists are commercially available in specified thicknesses of from about 0.6–3 mils (15–76 microns). These thick layers of resist encompass the electroplated metal so that thick metal contacts can be built up having straight walls.

The residual resist films are generally stripped in a commercial stripper solution, followed by a hot benzene sulfonic acid wash. However, this strong acid tends to attack metal layers on the integrated circuit device, thereby destroying the device.

Thus a search was instigated for a solvent system which would completely remove the photoresist, but which would not attack any materials normally found on integrated circuit devices, including materials such as silicon, silicon dioxide, silicon nitride, aluminum, gold, titanium or platinum, or in any other way introduce impurities or dopants into the integrated circuit materials.

SUMMARY OF THE INVENTION

We have found that a solution comprising tetramethylammonium hydroxide in a lower alcohol treats photoresist films so they can be completely removed from an integrated circuit substrate, but without attacking any of the materials of the integrated circuit. The addition of a small amount of a surfactant to the above solution improves the wetting of the exposed surfaces and increases the rate of resist removal.

DETAILED DESCRIPTION OF THE INVENTION

In the manufacture of integrated circuit devices, silicon wafers passivated with layers of silicon dioxide and silicon nitride are overcoated with metal layers, such as platinum and titanium. A thick metal contact, such as of gold, is then applied in certain areas. The wafers are covered with a thick film of photoresist, about 1 mil (25.4 microns) or the desired thickness.

Thick film photoresists suitable for use herein are dry films which are commercially available sandwiched between a polyethylene terephthalate film and a polyolefin film. The duPont de Nemours and Company's Riston films are suitable. The resist is applied to the substrate by removing the polyolefin film and using heat and pressure, as with a two roll laminator, to adhere the photoresist to the substrate.

The photoresist is then exposed through a mask, using for example, a light source emitting at a wavelength of about 3400–3800 angstroms, such as a high pressure mercury arc lamp, using an exposure level of about 100 millijoules $cm^2$. The polyethylene terephthalate sheet is then peeled off and the resist developed in a suitable solvent to form a series of openings in the resist layer, thereby exposing the underlying metal layers. Suitable developer solvents include butyl acetate-toluene mixtures, generally containing about 30–70 percent by volume of butyl acetate.

A thick gold contact is then formed in the resist openings by conventional electroplating techniques. A thick gold pad about the thickness of the resist layer is readily formed.

The remaining photoresist must now be stripped from the device. The present stripping system comprises a hot solution of tetramethylammonium hydroxide in alcohol, followed by immersion in 1,1,1-trichloroethane.

The tetramethylammonium hydroxide employed should be a pure material free of impurities such as sodium or potassium which could contaminate the integrated circuit devices. This compound is readily available commercially in a methanol solution and can be diluted further with a lower alcohol such as methanol, ethanol or propanol. Preferably the solution should contain about 15–17 percent by weight of solids.

The tetramethylammonium hydroxide solution can optionally contain a nonionic surfactant to improve the wetting of the substrate by the stripping solution and to increase the rate of reaction. Suitable surfactants include Triton X-100, a product of Rohm & Haas Company and Tergitol NPX, a polyethyleneglycol ether product of Union Carbide Corporation. Preferably 1–2 percent by weight of the tetramethylammonium hydroxide solution of a nonionic surfactant is added. The devices to be cleaned are immersed in the above solution heated to a temperature of about 70°–78° C.

In a preferred mode of operation, a device to be stripped of photoresist is first immersed in a hot (110°–125° C.) solution of commercial solvent, such as J100, a product of Industri Chemical and believed to contain a mixture of tetrachloroethylene, o-dichlorobenzene, phenol, benzenesulfonic acid and a small amount of a surfactant. Other stripper solutions are known to those skilled in the art and can be substituted. The treated wafers are then immersed in 1,1,1-trichloroethane and drying agents if desired. The device is then immersed in the tetramethylammonium hydroxide solution as described above and again in 1,1,1-trichloroethane as above.

Although the invention has been described with reference to stripping negative thick film resists, the present solvent system can be employed advantageously to strip other resists as well, including both negative resists and positive resists, particularly the Shipley Company's positive diazide naphthalene sulfonic acid derivative resists, such as AZ1350 photoresists. Such photoresists are employed for various masking operations required in the manufacture of various semiconductor devices and printed circuit boards.

The invention will be further described in the following Examples, but the invention is not meant to be limited to the details described therein. In the Examples parts and percentages are by weight.

EXAMPLE 1

Two parts of a solution containing 24 percent of tetramethylammonium hydroxide in methanol was diluted with 1 part of methanol. Two percent of Triton X-100 surfactant was stirred in and the resultant solution heated to about 78° C.

Several integrated circuit devices comprising a silicon wafer coated with a thermally grown $SiO_2$ layer, a passivating silicon nitride layer, a thin layer of titanium and a thin layer of platinum were coated with a 1 mil thick layer of Riston photoresist, exposed and developed to form openings to the layer of platinum. One mil thick gold bumps were electroplated using a commercial acid plating bath in the openings in the resist.

The devices were then treated for 8 minutes with a preliminary stripping solution of J-100. The devices were then rinsed by immersing for 1 minute each sequentially in 1,1,1-trichloroethane, methanol, 2-propanol and finally in distilled water and spun dried.

The devices were then immersed for 5 minutes in the tetramethylammonium hydroxide solution prepared as above, then rinsed by immersing in methanol for 1 minute, 1,1,1-trichloroethane for 2 minutes, methanol for 1 minute and finally in distilled water for 5 minutes and spun dried.

The photoresist was completely removed by the above procedure. No deleterious effects were noted in the cleaned devices.

COMPARATIVE EXAMPLES

The stripping procedure of Example 1 was followed except substituting other solutions for the tetramethylammonium hydroxide stripper solution as follows: 1:1 piperidine/tetramethylammonium hydroxide; methylene chloride/piperidine; A40 stripper of Allied Chemical Corp.; Patclin 220 stripper solution of the Patclin Company; resist stripper No. 99 of the Helma Chemical Corporation; Arnold Laboratories' products 99D and 99K; and Uresolv, a stripper of Dynalloy Corporation. None of these strippers was effective, either because they did not solubilize the photoresist completely, or because they attacked one or more materials present in the integrated circuit substrate.

We claim:
1. A method of stripping from a substrate a film of photoresist selected from the group consisting of diazide naphthalene sulfonic acid resists and resists derived from acrylic or methacrylic acids comprises
   immersing the substrate in a solution consisting essentially of tetramethyl ammonium hydroxide in a lower alcohol at a temperature from about 70°–78° C., and
   immersing the substrate in 1,1,1-trichloroethane.
2. A method according to claim 1 wherein from about 1–2 percent by weight of a surfactant is added to said tetramethylammonium hydroxide solution.
3. A method according to claim 1 wherein the concentration of tetramethylammonium hydroxide in said solution is from about 15–17 percent by weight.
4. A method according to claim 1 wherein said substrate is immersed in an organic solvent for said photoresist and is then immersed in 1,1,1-trichloroethane prior to immersion in the tetramethylammonium hydroxide solution.
5. A method according to claim 3 wherein from 1–2 percent by weight of a surfactant is added to said tetramethylammonium hydroxide solution.

* * * * *